(12) United States Patent
Bogdan et al.

(10) Patent No.: US 7,679,156 B2
(45) Date of Patent: Mar. 16, 2010

(54) OPTICAL MODULE AND OPTICAL SYSTEM

(75) Inventors: Danut Bogdan, Timisoara (RO); Josef Dirmeyer, Bodenwöhr (DE); Henryk Frenzel, Regensburg (DE); Harald Schmidt, Regensburg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/573,543

(22) PCT Filed: Sep. 14, 2004

(86) PCT No.: PCT/EP2004/052159

§ 371 (c)(1),
(2), (4) Date: Mar. 27, 2006

(87) PCT Pub. No.: WO2005/032123

PCT Pub. Date: Apr. 7, 2005

(65) Prior Publication Data

US 2006/0202293 A1    Sep. 14, 2006

(30) Foreign Application Priority Data

Sep. 26, 2003    (DE) .............................. 103 44 760

(51) Int. Cl.
*H01L 31/0232*    (2006.01)

(52) U.S. Cl. ................. 257/432; 257/433; 257/434; 257/680; 257/E33.076; 257/E31.127

(58) Field of Classification Search .......... 257/E31.127, 257/81, 82, 432, 433, 434, 680, E33.076, 257/E33.077; 250/239; 348/340; 359/819; 396/535

See application file for complete search history.

(56) References Cited

U.S. PATENT DOCUMENTS 5,400,072 A * 3/1995 Izumi et al. ................. 348/335

(Continued)

FOREIGN PATENT DOCUMENTS

DE    199 58 299 A1    6/2000

(Continued)

OTHER PUBLICATIONS http://www.merriam-webster.com/dictionary/external. 2009.*

*Primary Examiner*—Leonardo Andújar
*Assistant Examiner*—Leslie Pilar Cruz
(74) *Attorney, Agent, or Firm*—Laurence A. Greenberg; Werner H. Stemer; Ralph E. Locher

(57) ABSTRACT

An optical module has a circuit carrier, a housed semiconductor element placed on the circuit carrier, and a lens unit for projecting electromagnetic radiation onto the semiconductor element. The lens unit, which is constructed separate from the cased semiconductor element, preferably comprises a lens assembly formed of, for example, three lenses and of a diaphragm. The three lenses, optionally together with the diaphragm, are aligned in a well-defined manner due to their geometric design so that no additional optical adjustment is necessary. According to the invention, a support is formed, at least in sections, on the case of the semiconductor element, and the lens unit is placed thereon thus being supported. The concept is that by forming a support directly on the case of a cased semiconductor element even with classically cased semiconductor chips, it is possible to construct a camera module with which every mechanical focus setting can be eliminated. The novel system is particularly suited for use in the interior or exterior of a motor vehicle.

5 Claims, 2 Drawing Sheets

U.S. PATENT DOCUMENTS

| | | | |
|---|---|---|---|
| 6,683,298 B1 * | 1/2004 | Hunter et al. | 250/239 |
| 7,088,397 B1 * | 8/2006 | Hunter et al. | 348/374 |
| 2003/0048378 A1 * | 3/2003 | Kim et al. | 348/375 |
| 2003/0137595 A1 * | 7/2003 | Takachi | 348/340 |
| 2003/0184885 A1 * | 10/2003 | Tansho et al. | 359/819 |
| 2004/0080658 A1 * | 4/2004 | Cambou et al. | 348/340 |
| 2004/0109079 A1 * | 6/2004 | Fujimoto et al. | 348/340 |

FOREIGN PATENT DOCUMENTS

| | | |
|---|---|---|
| JP | 11261861 A | 9/1999 |
| JP | 2003-168792 | 6/2003 |

* cited by examiner

OPTICAL MODULE AND OPTICAL SYSTEM

BACKGROUND OF THE INVENTION

Field of the Invention

The invention relates to an optical module including a circuit carrier, a housed semiconductor element which is arranged on the circuit carrier, and a lens unit for projecting electromagnetic radiation onto the semiconductor element, wherein the housed semiconductor element and the lens unit are formed in two parts.

The invention also relates to an optical system including an optical module which is formed in this way.

Optical modules and systems of the type in question are used in motor vehicle technology in particular.

Electromagnetic radiation from various frequency ranges can be used in this context, wherein, in addition to the visible light by means of which applications such as Lane Departure Warning (LDW), Blind Spot Detection (BSD) or Rear View Cameras typically function in the external environment of a motor vehicle, infrared radiation which is invisible to humans is particularly preferred in the case of applications in the internal environment of a motor vehicle, such as Out of Position Detection (OOP), or in the case of additional external lighting for a Night Vision System.

Stringent requirements exist in the case of applications in the interior or exterior of a vehicle, due to external effects such as temperature, humidity, contamination and vibration. The typical service life of a system in a vehicle is 10 to 15 years, wherein only extremely low failure rates are tolerated, and therefore only very slow aging is permissible in the components of an optical system of the type cited at the beginning.

Since the installation space of optical modules or optical systems is very restricted in many cases, additional difficulties exist in the implementation of said optical systems. Using conventional means, it is therefore extremely difficult to construct a hermetically sealed and reliable unit comprising a camera chip (CCD or CMOS sensor) and an optics system.

In order for a camera system consisting of an image sensor (currently CCD or CMOS) and a lens system to achieve an adequate sharpness of image, the sensor and optics components must be compatible with each other in a manner which is geometrically very accurate. The tolerance range for the distance from camera chip to optics system in the z-axis is usually in the range of a few hundredths of a millimeter, in order to achieve an optimally sharp image for a specific focal depth range. This is problematic for so-called fixed-focus systems in particular, since these may be at best moderately subject to tolerances during manufacturing. An offset of the camera chip in relation to the optics system in the x-axis or y-axis also has the consequence that the optical system "squints" under certain circumstances, i.e. the image is cut off at one edge (horizontal or vertical) in each case because no more pixels are present there as a result of the offset, and said pixels should be available for precautionary reasons.

A further problem is presented by so-called "tilt", i.e. a tilting of the camera chip about the x-axis or y-axis, causing the image to exhibit unsharpness gradients in a horizontal or vertical direction. It is also possible for "rotation" to occur, i.e. a rotation about the z-axis of the camera chip in relation to the optics system.

Nearly all of the camera systems which are currently available on the market and are supplied with a fixed focus setting require a further tuning step during manufacturing, in which step the distance from the camera chip to the optics system along the z-axis is set and fixed at this value. This is done e.g. by means of a thread and a corresponding locking screw or an adhesive bond. A tuning step might also be required for the x-y offset or, if this does not take place, a correspondingly bigger sensor which equalizes the tolerances via an increase in pixels can be provided. Software calculation and calibration of the "rotation" is also known. Since the available information is sharp in other respects, the pixels merely have to be reassigned in a kind of "calibration process". However, it is not possible for any more information to be present at the edges or corners, since these have been cut off. Finally, a purely mechanical reduction of "tilt" and "rotation" between chip and optics system in the case of normal systems can generally only be achieved by high-precision manufacturing and assembly or by a tuning of components.

For reasons of cost and aspects of quality assurance, however, it should be possible to produce cameras for specific low-cost applications, such as e.g. automotive, industry, digital cameras, mobile phones, toys, etc., with a minimum of adjustment operations between optics system and camera chip, i.e. without performing focus settings in relation to the optical surface of the CMOS or CCD sensor. This essentially conflicts with the cited requirements.

One possibility for developing a focus-free system is to reduce the total number of possible tolerances and elements, such that the module or system functions without adjustment at least within a specific range of distances and temperatures by virtue of its design. When using the invention e.g. in the context of a passenger protection system in a motor vehicle, to which the present invention is not restricted, however, it should be possible to guarantee sharp images at distances of e.g. 15 cm to 130 cm and at temperatures of e.g. −40° C. to +105° C. The fewer the elements in the tolerance chain, the more readily this can be implemented. In the case of housed semiconductor elements, a large part of the tolerance chain relates in particular to the required soldered joints and possibly adhesive joints or similar between chip and circuit carrier.

By using only one lens, it is possible to avoid giving rise to additional optical tolerances as a result of a complicated lens structure. The lens holder itself, which is preferably made of plastic, can be connected to the lens assembly in various ways, such that it is always possible to ensure an exact optical alignment of the lens assembly and the semiconductor element in relation to the lens holder or the lens assembly.

However, in the case of systems which to a large extent exhibit a conventional structure comprising objective and camera chip, wherein the camera chip or semiconductor element is deposited in a housing on a suitable circuit carrier, it is difficult to circumvent the cited problems in their entirety and at the same time satisfy the cited quality requirements. In fact, special measures need only be adopted against extraneous light radiation or other environmental effects from the front in the case of housed semiconductor chips, since the chip housing offers an adequate protection from the rear e.g. for the silicon which is transparent for IR radiation. However, the objective itself must be aligned with the camera chip and exhibit a defined focusing. This currently takes place using locking possibilities which are subject to tolerances, e.g. by screwing, adhesive bonding or similar, by means of which the objective is fixed relative to the camera chip on the circuit carrier.

SUMMARY OF THE INVENTION

The invention addresses the problem of providing an optical module and an optical system comprising a housed semiconductor element which is arranged on a circuit carrier, in which the possible tolerance chain is minimized such that, in the context of simple and inexpensive assembly, a reliable optical quality can be provided without alignment effort and particularly without focusing effort, and that said quality can be maintained over the service life of the module or system. Moreover, necessary measures against extraneous light radiation or other environmental effects from the front should be eliminated as far as possible.

This problem is solved by the features in the independent patent claims. Advantageous embodiments of the invention, which can be implemented individually or in combination with each other, are specified in the dependent claims.

The invention builds on the optical module of the type in question, in that a support is formed, at least in sections, on the housing of the semiconductor element, and a lens unit is arranged on and supported by said support. This is easy to implement especially when using molded plastic housings, since in addition to the shape of the actual housing, the edge region in particular can be configured almost without restriction, in particular as a defined reference layer and in particular in relation to the chip. In this way, the tolerance range which is available for the focusing is kept as small as possible, such that it now comprises only manufacturing tolerances of the support and the lens unit. Furthermore, the proposed solution has the advantage that, as a result of the direct contact of lens unit and housed chip, the lateral ingress of extraneous light is largely prevented.

According to the invention the support is preferably formed as a ring collar, which is however at least partially tilt-free, whereby not only is the distance and therefore the focusing range advantageously kept within the required dimensions, a tilting of the components in relation to each other is also reduced to a minimum.

In a first development of the invention, the lens unit includes a base lens, wherein the support of the lens unit takes place via the base lens. This is advantageously done in such a way that a design for the base lens is selected which includes a surface section that is formed so as to correspond to the support, e.g. is plane at least in sections, wherein said surface section is positioned on the supports which are formed on the housing of the semiconductor element.

In an alternative development of the invention, the lens unit includes a lens holder, wherein the support of the lens unit takes place via the lens holder. This is advantageously done in such a way that a design for the lens holder is selected which includes a surface section that is formed so as to correspond to the support, e.g. is plane at least in sections, wherein said surface section is positioned on the supports which are formed on the housing of the semiconductor element. Because the support extends further outwards, the support on the lens holder advantageously further reduces risk of tilting. It also allows the formation of smaller modules than modules having a support via a base lens.

According to the invention, the base lens or the lens holder advantageously has a collar, at least in sections, which is part of the lens and is formed so as to correspond essentially to a locating face which is formed on the support. This is easy to implement especially when using molded plastic lenses, since in addition to the optically effective surface of the lens, irrespective whether this has a conventionally curved or plane form, the edge region can be configured almost without restriction, in a similar manner to the chip housing according to the present invention.

In a particularly preferred embodiment, a locating face is formed on the support, at least in sections. The locating face can be non-conical or, in a development of the semiconductor element, tapered and in particular conical considered in the direction of the optical axis of the module. In such a configuration, a type of self-centering can advantageously occur, thereby ensuring an exact positioning of the optics system in relation to the chip with reference to the x-axis and y-axis as well as reducing the "tilt" to a minimum.

The invention also consists of an optical system including an optical module of the type cited above. In this way, the advantages of the optical module also become valid in the context of an overall system.

The invention is based on the discovery that by forming, at least in sections, a support directly on the housing of a housed semiconductor element, even in the case of conventionally housed semiconductor chips where (independently of the optics system) only the component for a standard SMD is loaded, a camera module can be constructed in which it is possible to dispense with any mechanical focus setting. Fully automatic manufacturing of the module is therefore possible, having the advantage that the manufacturing and assembly costs are reduced in the case of large numbers of units. Furthermore, the optical module can be developed without active parts such as threads or locking screws, thereby resulting in greater reliability. As a result of the limited tolerances in the construction, including in the x-axis and y-axis, the chip surface need not be unnecessarily large, thereby making the camera chip cheaper. The construction of such a module can be configured to be relatively compact, which is advantageous in that the camera module can also be used in applications that are subject to conditions of limited space. Finally, the integrative construction also advantageously offers protection against extraneous light radiation.

The invention is particularly useful in the implementation of video systems, possibly in combination with radar systems, ultrasound systems or the like in the field of motor vehicles.

The invention is now explained by way of example with reference to preferred embodiments and with reference to the accompanying drawings in which, schematically,

DESCRIPTION OF THE PREFERRED EMBODIMENTS

In the following description of the preferred embodiments of the present invention, identical reference signs designate identical or comparable components.

Figure 1:
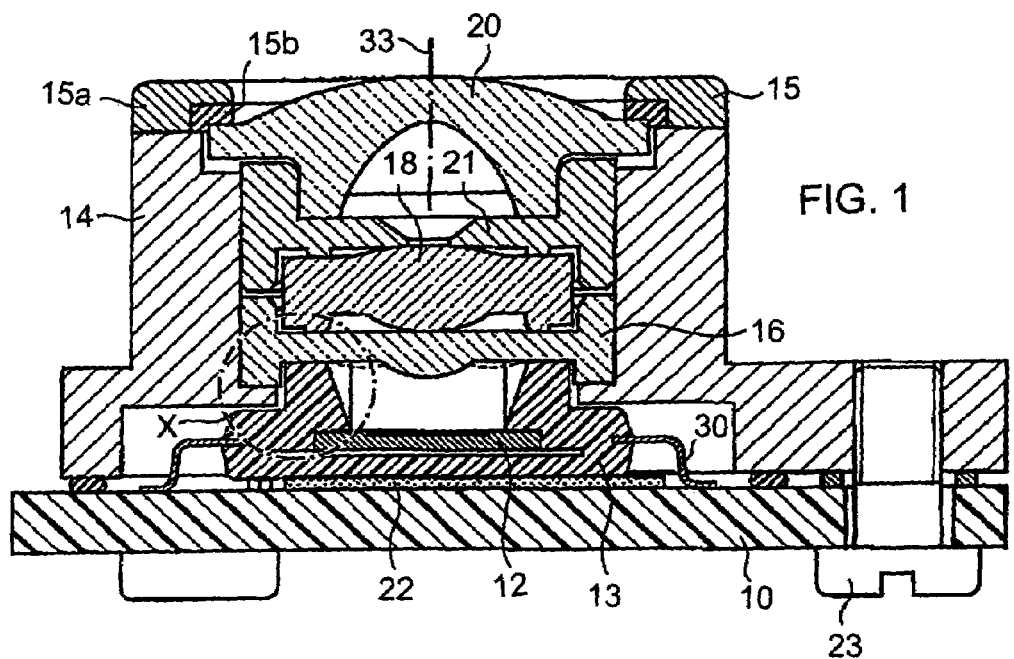
FIG. 1 shows a sectional view of an optical module according to the invention.
Figure 2:
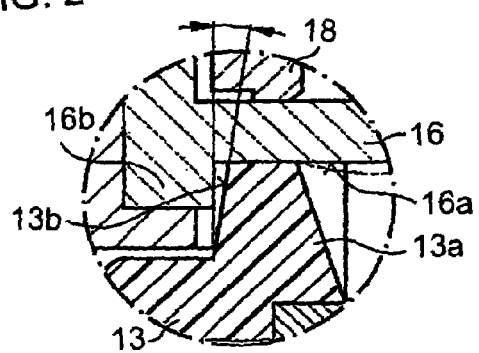
FIG. 2 shows a magnified section X of the module as per FIG. 1.
Figure 3:
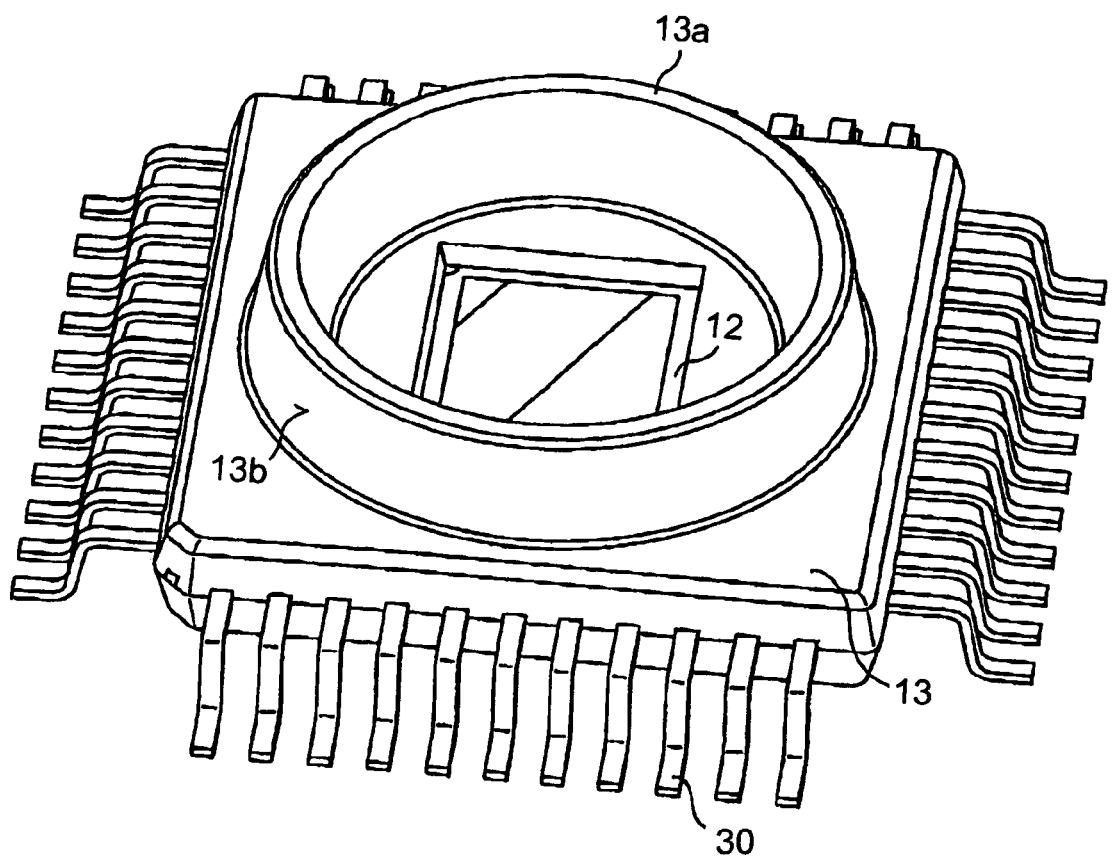
FIG. 3 shows a semiconductor element which is formed in accordance with the invention.

Using different sections and perspectives, FIGS. 1 to 3 show an optical module including a circuit carrier 10, a housed (packaged) semiconductor element 12 which is arranged on the circuit carrier 10, and a lens unit 14, 16, 18, 20, 21 for projecting electromagnetic radiation onto the semiconductor element 12. The lens unit 14, 16, 18, 20, 21, which is formed separately from the housed semiconductor element 12, comprises a lens holder 14 and a lens assembly 16, 18, 20, 21 including at least one lens 20 and possibly an aperture 21.

The invention provides for a support 13a to be formed, at least in sections, on the housing 13 of the semiconductor element 12, and the lens unit 14, 16, 18, 20, 21 to be arranged and supported on said support 13a. The support of the lens unit 14, 16, 18, 20, 21 takes place either via the lens 16, which is preferably formed as a so-called base lens 16, or the lens holder (not shown). In this regard, base lens 16 or lens holder feature, at least in sections, a surface section 16a which is formed so as to correspond to the support 13a, has a plane form by way of example in the figures, and is positioned on the support 13a which is formed on the housing 13 of the semiconductor element 12. Moreover, the base lens 16 or the lens holder features, at least in sections, a collar 16b which is formed so as to correspond essentially to a locating face 13b which is formed on the support 13a. The support 13a is therefore preferably formed in the shape of a ring collar 13a. The locating face 13b of the ring collar 13a is preferably conically formed considered in the direction of the optical axis 33 of the module, such that it is advantageously easier, not just for automated manufacturing, to achieve a type of self-centering of adjacent components, in this case lens 16 and support 13a.

Provision is preferably made for a lens assembly 14, 16, 18, 20, 21 including a plurality of lenses 16, 18, 20 and possibly at least one aperture 21 in the form of a housing. The optical quality can be improved by means of an objective including a plurality of lenses, this also being possible in the context of the present invention, in particular because it is possible to work with small tolerances. In this context, it is also particularly advantageous that the lenses 16, 18, 20 and possibly the aperture 21 are in direct contact with each other. This practically excludes variations in the lens assembly 16, 18, 20, 21 in a z-direction, i.e. in the direction in which the lenses are sequential. The tolerances are now only dependent on the lens assembly 16, 18, 20, 21 itself. It is likewise particularly useful that the relative positions of the lenses to each other are determined by the geometry of the lenses 16, 18, 20 and possibly apertures 21 themselves. The arrangement of the lenses in an x-y direction can also be determined by the lenses themselves, namely by configuring the locating faces of the lenses or apertures correspondingly.

The lenses 16, 18, 20 or apertures 21 which are held in the lens holder 14 are therefore advantageously formed in such a way that they assume a defined position relative to each other within the lens holder 14. Furthermore, at least one of the lenses 20 is configured in such a way that it engages with the lens holder 14 and therefore also occupies a defined position relative to the semiconductor element 12. In this way, all lenses 16, 18, 20 are aligned relative to the semiconductor element 12.

In addition, this alignment is not jeopardized as a result of the lens holder 14 being connected to the circuit carrier 10, e.g. via a screw connection 23. The housed semiconductor element 12 is arranged on the circuit carrier 10 via lead frames 30. Provision can also be made for an adhesive joint 22 or other known connection methods.

It is particularly useful that just one of the lenses or apertures is directly in contact with the lens holder (not shown). Since the lenses determine their relative positions among themselves, it is sufficient to fix a single specific lens or aperture to the lens holder. In this way, the whole lens assembly is oriented in relation to the semiconductor element, whereby ultimately the advantageous optical quality can be guaranteed. In this context, it is particularly advantageous if the single specific lens is connected to the lens holder in a waterproof and dust-proof manner. It is advantageous if the uppermost lens is selected as the lens which engages with the lens holder for sealing purposes. This can be achieved by connecting the single specific lens to the lens holder by means of ultrasound bonding, laser welding or adhesive bonding, for example, alternatively or additionally using screws and/or a cementing compound in some cases.

Provision can also be made for the lens assembly to be snapped via catching means (likewise not shown) into the region holding the lenses. This can also ensure that exact positioning is achieved. It should also be emphasized that this option ensures simpler separation possibilities between the lenses and the remaining components, in particular the expensive semiconductor element. The sealing effect can be provided in a particularly advantageous manner, particularly in the context of a snap-in assembly, if the lenses feature a hard and a soft component, wherein the soft component is arranged at the circumference of the lens for the purpose of sealing. The soft component also satisfies the general requirement that the lenses must not be subjected to any stresses when they are snapped in; stresses would always result in an adverse effect on the optical properties.

The lens assembly 16, 18, 20, 21 is preferably held in the lens holder 14 by means of a holding element 15 (molded ring). The holding element 15 preferably has a hard component 15a and, at least in sections, a permanently elastic component 15b. A permanently elastic component 15b, which is preferably circumferentially formed, can be used in particular for sealing the lens assembly 16, 18, 20, 21 against humidity and contamination at the same time—in addition to its specific function of offsetting any stresses which may occur due to mechanical and/or thermal conditions. The permanently elastic component 15b is preferably formed on the circumference which fits against the lens 20. In the region of the harder component 15a, the holding element 15 is arranged on the region 14 which holds the lenses, e.g. by means of ultrasound bonding, laser welding, adhesion, riveting, molding, or other connection method which is similarly easy to automate. Screw connections and snap-in connections are also conceivable. The hard component 15a of the holding ring 15 preferably comprises a thermoplastic material. A permanently elastic component 15b which preferably comprises thermoplastic elastomers (TPE) or silicone or similar has proven itself accordingly. For the purpose of providing an integrated and easily manageable component 15, the permanently elastic component 15b is preferably molded onto the hard component 15a or vice versa, e.g. using a two-component injection method.

Furthermore, the prevention of undesired optical effects, particularly due to lateral light ingress, by means of blackening and/or matting or by using total reflection (not shown) can be particularly advantageous. These are examples of suitable measures.

Finally, the invention usefully allows the module to be connected to, particularly soldered onto (e.g. by means of hot-bar soldering), a rigid circuit board (these are also known as rigid-flexible systems) via a flat cable or in particular by means of a flexible PCB if this is used as a circuit carrier. This is a particularly flexible solution for connecting the circuit carrier 10 or the module to a control unit or circuit board (not shown).

As a result of the formation, at least in sections, of a support 13a directly on the housing 13 of a housed semiconductor element 12, the invention allows the construction of a camera module in which it is essentially possible to dispense with any mechanical focus setting. Fully automatic manufacturing of the module is therefore possible, this having the advantage that the manufacturing and assembly costs are reduced in the case of large numbers of units. In particular, the optical module can be developed without active parts such as threads or locking screws, thereby resulting in greater reliability. Furthermore, as a result of the limited tolerances in the construction, including in the x-axis and y-axis, the chip surface need not be unnecessarily large, thereby making the camera chip cheaper. The construction of such a module can be configured to be relatively compact, which is advantageous in that the camera module can also be used in applications that are subject to conditions of limited space. Moreover, the construction offers the possibility of devising a hermetically sealed module which is well protected against environmental effects such as humidity or dust.

The features of the invention, which are disclosed in the present description, in the drawings and in the claims, can be essential for the realization of the invention, both individually and in any combination. The invention is particularly suitable for applications in the interior and/or exterior of a vehicle.

We claim:

1. An optical module, comprising:
   a circuit carrier;
   a housing including at least sections with a ring-shaped support formed thereon, said housing disposed on said circuit carrier, said ring-shaped support defining an outer boundary of said housing;
   a semiconductor element disposed in said housing; and
   a lens unit configured for projecting electromagnetic radiation onto said semiconductor element, said lens unit including a base lens;
   wherein said semiconductor element and said lens unit are formed in two parts, said base lens includes at least sections formed with a collar that has a shape corresponding to said ring-shaped support that is formed on said housing, and said collar of said base lens is directly supported on said ring-shaped support that is formed on said housing; and
   wherein said lens unit includes a lens holder and said lens holder is supported by said circuit carrier substantially without being supported by said housing, and
   wherein said base lens is disposed externally from said housing.

2. The optical module according to claim 1, wherein said outer boundary of said housing, which is defined by said ring-shaped support, is external to all portions that are integrally formed with said housing.

3. The optical module according to claim 1, wherein said housing is not disposed between said lens holder and said base lens.

4. The optical module according to claim 1, wherein said housing protects said semiconductor element from infrared radiation.

5. The optical module according to claim 1, wherein said housing and said semiconductor element form an integral unit that does not package said base lens.

* * * * *